(12) United States Patent
Lee et al.

(10) Patent No.: US 9,395,469 B2
(45) Date of Patent: Jul. 19, 2016

(54) METHODS FOR FABRICATION OF STABLE ULTRA-LOW REFLECTIVE SURFACE AND THE ULTRA-LOW REFLECTIVE SURFACE ITSELF

(71) Applicant: KOREA INSTITUTE OF SCIENCE AND TECHNOLOGY, Seoul (KR)

(72) Inventors: Heon Ju Lee, Gyeonggi-do (KR); Myoung Woon Moon, Seoul (KR); Kyu Hwan Oh, Seoul (KR); Seong Jin Kim, Seoul (KR); Eu Sun Yu, Seoul (KR); Tae Jun Ko, Seoul (KR); Seung Chul Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 118 days.

(21) Appl. No.: 14/260,679

(22) Filed: Apr. 24, 2014

(65) Prior Publication Data

US 2014/0320969 A1 Oct. 30, 2014

(30) Foreign Application Priority Data

Apr. 25, 2013 (KR) ........................ 10-2013-0046220

(51) Int. Cl.
  *G02B 1/11* (2015.01)
  *B23H 1/00* (2006.01)
  *C23C 14/30* (2006.01)
  *G02B 1/118* (2015.01)
  (Continued)

(52) U.S. Cl.
  CPC .............. *G02B 1/118* (2013.01); *C23C 14/028* (2013.01); *C23C 14/14* (2013.01); *C23C 14/5853* (2013.01); *B23H 9/008* (2013.01)

(58) Field of Classification Search
None
See application file for complete search history.

(56) References Cited

U.S. PATENT DOCUMENTS

2003/0001274 A1* 1/2003 Den ........................ B82Y 10/00
  257/761
2009/0011241 A1 1/2009 Zhu et al.
(Continued)

FOREIGN PATENT DOCUMENTS

KR  1020060111294 A  10/2006
KR  20100094101 A  8/2010
(Continued)

OTHER PUBLICATIONS

Korean Notice of Allowance dated Sep. 30, 2014; Appln. No. 10-2013-0046220.
(Continued)

*Primary Examiner* — Shamim Ahmed
(74) *Attorney, Agent, or Firm* — Ladas & Parry LLP

(57) ABSTRACT

A method to prepare low reflective surface according to an example of the present invention comprises: the first step to prepare materials having pillar structure on the surface; the second step to prepare aluminum surface-materials by treating for the pillar structure to have aluminum surface; and the third step to prepare a low reflective surface with dual protuberance structure by forming nano-flake layer on the pillar surface of the material surface through oxidation of the surface aluminum of the aluminum surface-materials. The method to prepare low reflective surface can provide a low reflective surface structure that can be applied to photovoltaic device surface or various display surface as a surface able to reduce reflection significantly by absorbing wavelengths in the range of visible and infrared ray through internally total reflection with simple, low cost, and ecofriendly process.

11 Claims, 13 Drawing Sheets

(51) Int. Cl.
*C23C 14/02* (2006.01)
*C23C 14/14* (2006.01)
*C23C 14/58* (2006.01)
*B23H 9/00* (2006.01)

(56) References Cited

U.S. PATENT DOCUMENTS

| | | | | |
|---|---|---|---|---|
| 2009/0274873 | A1* | 11/2009 | Shinotsuka | B82Y 10/00 428/143 |
| 2012/0080361 | A1* | 4/2012 | Walavalkar | B01D 67/0062 209/235 |
| 2012/0118739 | A1* | 5/2012 | Walavalkar | C12Q 1/6869 204/543 |
| 2013/0038949 | A1* | 2/2013 | David | B29C 59/14 359/742 |
| 2013/0340824 | A1* | 12/2013 | Oh | H01L 31/02168 136/256 |

FOREIGN PATENT DOCUMENTS

| | | |
|---|---|---|
| KR | 101019029 A | 3/2011 |
| KR | 20120082179 A | 7/2012 |
| KR | 1020130026273 A | 3/2013 |

OTHER PUBLICATIONS

John Toon; "Superhydrophobic: Self-Cleaning, Low-Reflectivity 3-D Surface Treatment Could Boost Efficiency for Photovoltaic Cells", Georgia Tech. Research News, Mar. 24, 2009, 3 pages.

Kyoo-Chul Park, et al; "Nanotextured Silica Surfaces with Robust Superhydrophobicity and Omnidirectional Broadband Supertransmissivity", ACSNANO; vol. XXX; No. XX; 11 pages; Publication Date (Web): Apr. 8, 2012.

S.J. Wilson, et al; "The Optical Properties of 'Moth Eye' Antireflection Surfaces", Optica Acta: International Journal of Optics, vol. 29, No. 7; pp. 993-1009; Jul. 1982.

* cited by examiner

METHODS FOR FABRICATION OF STABLE ULTRA-LOW REFLECTIVE SURFACE AND THE ULTRA-LOW REFLECTIVE SURFACE ITSELF

FIELD OF THE INVENTION

The present invention relates to a method for preparing a surface structure forming a dual nanostructure on a surface thereof to reduce reflectance significantly and to transmit or absorb light well, and a surface structure with self-cleaning function to maintain the ultra-low reflection property in a continuous manner.

BACKGROUND OF THE INVENTION

A surface reducing reflection and transmitting or absorbing light well has direct relationship with efficiency of optical device in solar photovoltaic generation as well as various displays, road signs, and various optical devices, so is an issue recently. In particular, currently developed low reflective surfaces or low reflective coating techniques are poor durability against contaminations, so has a difficulty in commercialization due to deterioration of its low reflection property and difficulty in management with the lapse of time.

Low reflective surface found in nature includes eyes of nocturnal insects. These eyes have a special micro-nano scale structure and many researches have obtained anti-reflecting effect by applying the structure. These regular array of protuberances enables them to live with minimum light even in night by reducing light reflectance and increasing transmission [S. J. Wilson & M. C. Nutley, "The Optical Properties of 'Moth Eye' Antireflection Surfaces," Optica Acta: International Journal of Optics, Volume 29, issue 7, 1982].

A lot of methods to conventionally prepare the regular array of protuberances have been suggested by other researchers. Representative techniques include E-beam evaporator, CVD, RF sputtering, plasma etching, RIE, sol-gel, hydrothermal method, and so forth. In 2012, it has been reported to develop a self-cleaning Si surface using RIE and nano imprinting technology, in which reflectance is significantly lowered and durability is enhanced [journal ACS Nano: "Nanotextured Silica Surfaces with Robust Super-Hydrophobicity and Omnidirectional Broadband Super-Transmissivity, 2012, K. C. Park, H. Choi etc]. However, this method has some demerits such as complicated preparation process and significantly high cost because it is required to prepare a mask previously and the process is composed of several steps. As another study, there has been an attempt for application to a photovoltaic cell to fabricate a pyramid structure on a silicone surface using wet etching to be a relatively cheap and simple method, and since HF is utilized as an etchant, this process has drawbacks including risks in process and high cost for safety equipment [Georgia Institute of Technology, 2009, John Toon, Self-cleaning, low-reflectivity treatment boosts efficiency for photovoltaic cells, not published].

Accordingly, to overcome these problems, the present invention suggests a method to reduce a surface reflectance with a simple, relatively cheap, and eco-friendly process and the surface structure using the same.

SUMMARY OF THE INVENTION

An object of the present invention aims at forming a metal or non-metal surface structure (surface material) with remarkably low reflectance, thus providing a method for fabrication of ultra-low reflective surface structure in a simple, inexpensive, and eco-friendly manner. In addition, there is provided a continuous ultra-low reflective surface structure with excellent durability and self-cleaning function prepared by the present method.

In order to achieve the aforementioned object, the method to fabricate an ultra-low reflective surface structure according to an embodiment of the present invention comprises: a first step to prepare a material containing a pillar structure on a surface thereof; a second step to prepare an aluminum surface-material by forming aluminum layer on the pillar structure of the material; and a third step to prepare ultra-low reflective surface with a dual protuberance structure by oxidizing aluminum on the aluminum surface-material to form a nano flake layer onto the pillar structure of the surface. The nano flake layer includes needle-like or plate-like nano flakes formed onto the pillar structure of the surface.

The pillar structure in the first step may be formed by etching the surface of the material according to at least one method selected from the group consisting of plasma etching, reactive ion etching, ion-milling, and electro discharge machining (EDM).

The pillar structure in the first step may be formed by plasma etching for the surface of the material between 30 sec and 90 min, including any one reactive gas selected from the group consisting of $CF_4$, $CHF_3$, $C_2F_6$, $C_2Cl_2F_4$, $C_3F_8$, $C_4F_8$, $SF_6$ and a combination thereof.

The aluminum layer in the second step may be formed by at least one process selected from the group consisting of sputtering, e-beam evaporation, and thermal evaporation.

The water oxidation in the third step may be performed by contacting aluminum on the aluminum surface material with a water-containing reactive solution or the vapor therefrom.

The reactive solution or vapor therefrom may have temperature at a range of 70 to 90° C.

The nano flake may include any one selected from the group consisting of boehmite (ALO(OH)), aluminum oxide ($Al_2O_3$) and a combination thereof, and be composed of them.

The ultra-low reflective surface may have hydrophilicity on which pure water contact angle is less than 10 degree.

The method may further include a forth step of applying a hydrophobic coating on the ultra-low reflective surface after the third step.

Cone shaped pillars with 500-1500 nm of height and 50-200 nm of width may be presented within 20-40 millions/mm per a unit area on the surface of the material containing the pillar structure.

The aluminum layer may be formed in a thickness of 10-100 nm.

According to another embodiment of the present invention, the ultra-low reflective surface includes a material containing a pillar structure on a surface thereof, and a nano flake layer placed in the pillar structure onto the surface of the material, wherein the nano flake layer includes needle-like or plate-like nano flakes and wherein the nano flakes include any one selected from the group consisting of boehmite (ALO(OH)), aluminum oxide ($Al_2O_3$), and a combination thereof.

The nano flakes may be formed at a height of 10-100 nm.

Cone shaped pillars with 500-1500 nm of height and 50-200 nm of width may be presented within 20-40 millions/mm per a unit area on the surface of the material comprising the pillar structure.

The ultra-low reflective surface may have superhydrophilicity on which pure water contact angle is less than 10 degree.

The ultra-low reflective surface may further include a hydrophobic polymer between nano flakes in the nano flake layer, on the nano flake layer, or both.

The ultra-low reflective surface may have self-cleaning function along with superhydrophobicity on which pure water contact angle is more than 130 degree.

The hydrophobic polymer may be any one selected from the group consisting of hexamethyldisiloxane (HMDSO), tetramethylsilane, and a combination thereof.

The photovoltaic system according to another embodiment of the present invention includes the ultra-low reflective surface structure.

The road sign according to another embodiment of the present invention includes the ultra-low reflective surface structure.

The advertisement board according to another embodiment of the present invention includes the ultra-low reflective surface structure.

Further scope of applicability of the present invention will become more apparent from the detailed description given hereinafter.

The nano flake herein refers to a structure that a plate-like structure with a height of several~several tens nano meter is inclined perpendicularly or slightly from the surface to form a radial shape.

The dual protuberance structure herein means a hierarchical dual protuberance structure that nano flakes including needle-like, plate-like shape or both form a secondary protuberance structure on the primary protuberance structure of a pillar structure containing cone, cylindrical, irregular surfaced pillars, and so on.

The self-cleaning function in the present invention means a function that contaminants are hardly attached to the surface and separated easily if attached due to hydrophobicity or superhydrophobicity of surface, thereby being capable of maintaining the surface clean for a long time even without a special cleaning process.

The surface structure herein refers to a material or article containing the surface structure prepared by the fabrication method as presented below regardless of its shape, thickness, or combination with other materials, and includes a surface combined with it.

The method to fabricate the ultra-low reflective surface structure of the present invention provides a surface technology capable of maintaining features of ultra-low reflective surface for a long time and having self-cleaning function. The present method for fabrication of the ultra-low reflective surface structure is a preparation method of an ultra-low reflective surface that provides not only an eco-friendly preparation process by minimizing use of toxic chemicals but also excellent durability. The present method for fabrication of the ultra-low reflective surface structure suggests a technology capable of remarkably reducing reflectance to below 1-2% that a micro pillar structure with a regular array is established and a nano flake structure is formed on a surface thereof to significantly reduce reflectance and to obtain higher absorption even with little light.

A method for fabrication of ultra-low reflective surface structures according to an example of the present invention comprises: a first step to prepare a material containing a pillar structure on a surface thereof; a second step to prepare an aluminum surface-material by forming aluminum layer on the pillar structure of the material; and a third step to prepare ultra-low reflective surface with a dual protuberance structure by oxidizing aluminum on the aluminum surface-material to form a nano flake layer onto the pillar structure of the surface.

Anything capable of forming a pillar structure may be applied to the material of the first step. The material may be metal, non-metal, polymer and a combination thereof, wherein the metal, for example, may be aluminum and the non-metal, for example, may be silica.

The material may include a fine and regular pillar structure with below micro-scale and may be a material prepared to include a pillar structure on a surface thereof by etching the surface of a smooth faced material.

The fabrication to contain a pillar structure on the surface may be processed by etching the surface of the material according to at least one method selected from the group consisting of plasma etching, reactive ion etching, ion-milling, and electro discharge machining (EDM) to form a regular pillar structure on the surface.

The pillar structure of the first step may be formed through plasma etching for the surface of a material using a reactive gas. The reactive gas may be any one selected from the group consisting of $CF_4$, $CHF_3$, $C_2F_6$, $C_2Cl_2F_4$, $C_3F_8$, $C_4F_8$, $SF_6$, and a combination thereof, and the etching time may be between 30 sec and 90 min.

Especially in case that the material is a non-metal material including silicon, the silicone may be etched in a feasible manner by reaction with $CF_4$ plasma and since this process does not need a special lithography process, it is possible to prepare a material containing a pillar structure on a surface thereof through dry etching for a short time.

Preferably, the material containing a pillar structure on a surface thereof may include cone-shaped pillars with 500-1500 nm of height and 50-200 nm of width, wherein the pillars may be presented within 20-40 million/$mm^2$ per a unit area.

The second step is a step to prepare an aluminum surface-material by forming aluminum layer on the pillar structure of the material. Although it is possible to form the aluminum surface of the second step without special treatment when the material is aluminum, it is possible to form aluminum layer to a part or whole of the surface material when the material has a surface other than aluminum. The aluminum layer may be formed by at least one process selected from the group consisting of sputtering, e-beam evaporation and thermal evaporation, and it is preferable to apply a process capable of forming aluminum layer even on the side of pillar and the surface between pillars. The aluminum layer may be formed in a thickness of 10-100 nm, preferably 30-50 nm.

The third step is a step to form a nano flake layer on the pillar surface of the material surface through oxidation of the aluminum surface-material.

The oxidation may be performed by contacting aluminum on the aluminum surface material with a water-containing reactive solution or the vapor therefrom.

The reactive solution may be anything containing water, and may be anything containing distilled water, deionized water and a combination thereof, and may be composed of water, or acid with water, a salt containing Cl and a combination thereof. For example, sodium chloride (NaCl) may be applied as a salt containing Cl.

The reactive solution may be applied in state of liquid or vapor. Preferably, the reactive solution or the vapor therefrom may be 70-90° C. or 80-90° C.

The contact for water oxidation may be accomplished for 1-10 min. When the contact for the oxidation is accomplished within the time scope, it is possible to form nano flakes in an appropriate and effective manner.

The aluminum layer is oxidized to react with the reactive solution or its vapor, resulting in formation of nano flakes where needle-like or plate-like structures are formed densely, and these nano flakes consists of a single layer to form a nano flake layer.

The nano flake may include any one selected from the group consisting of boehmite (ALO(OH)), aluminum oxide ($Al_2O_3$) and a combination thereof.

The nano flakes may be at a height of 10-100 nm in case of needle-like shape, at a height of 10-100 nm and in a width of 10-100 nm in case of plate-like shape, and both may be coexist.

The ultra-low reflective surface structure includes a surface having a hierarchical dual protuberance structure that nano flakes (the secondary protuberance structure) are formed on the pillar structure (the primary protuberance structure).

The ultra-low reflective surface structure may have less than 10% of light reflectance in a visible and infrared light wavelength region. In addition, the ultra-low reflective surface material may have light reflectance of less than 2% in a range of 200-1200 nm by adjusting the treatment condition. In addition, it is possible to provide a surface having less than 1% of light reflectance in a visible and infrared light wavelength region.

Further, the ultra-low reflective surface structure may have excellent durability to maintain this low reflectance without aging effect and as illustrated experimentally, this surface property can be maintained without aging effect for at least 60 days.

The ultra-low reflective surface structure may have a hydrophilic surface property, on which pure water contact angle may be less than 20 degree, or 10 degree.

The method to prepare an ultra-low reflective surface structure may further include the forth step of applying a hydrophobic coating on the ultra-low reflective surface after the third step.

The hydrophobic coating is an example to make the hydrophilic surface of the ultra-low reflective surface structure with hydrophobicity or superhydrophobicity, and it is possible to make the ultra-low reflective surface structure with hydrophobicity or superhydrophobicity using a relatively simple method.

The hydrophobic coating may be accomplished using hydrophobic or superhydrophobic polymer, wherein the hydrophobic or superhydrophobic polymer may be any one selected from the group consisting of hexamethyldisiloxane (HMDSO), tetramethylsilane, and a combination thereof.

The ultra-low reflective surface structure passing through the forth step has self-cleaning function in the senses that the surface is hardly contaminated due to its hydrophobicity or superhydrophobicity. The self-cleaning function of the ultra-low reflective surface structure may be usefully applied to, inter alia, an article that light reflection lowers a function or efficiency thereof but surface contamination occurs easily, for example a surface including a collecting plate in a solar cell, road sign, advertisement board, television or frame, vehicle glass, and so forth.

In case of applying silicone as an ultra-low reflective surface structure, it is possible to form a pillar structure through dry etching within a relatively short time due to excellent reactivity with $CF_4$ plasma, and the surface of the pillar structure therethrough is evaporated or coated with several tens nano meter of thin aluminum layer using sputtering or e-beam deposition, followed by contacting with a water-containing reactive solution or the vapor therefrom for several minutes. As a result, a flake-shaped nano structure is additionally formed, leading to formation of a dual protuberance structure.

This structure may have noticeably low reflectance in a visible and infrared light wavelength region and particularly be applied to a solar cell.

In case of applying metal as an ultra-low reflective surface structure, it is also possible to provide a surface material having a dual protuberance structure through the same process and especially when using aluminum as a material, it is possible to further shorten fabrication process of the ultra-low reflective surface structure because the secondary step may be omitted.

The method to prepare the ultra-low reflective surface structure may provide an ultra-low reflective surface structure having a hierarchical dual protuberance with an eco-friendly, relatively simple and short time process as the formation of nano flake utilizes a water-containing reactive solution.

The ultra-low reflective surface structure according to another embodiment of the present invention includes a material containing a pillar structure on a surface thereof, and a nano flake layer placed in the pillar structure onto the surface of the material. The nano flake layer includes needle-like or plate-like nano flakes. The nano flakes may include any one selected from the group consisting of boehmite (ALO(OH)), aluminum oxide ($Al_2O_3$), and a combination thereof, and may be composed of boehmite (ALO(OH)) and aluminum oxide ($Al_2O_3$), and be composed of them.

The material such as non-metal, metal, and polymer includes any material to have a pillar structure and to obtain an ultra-low reflective property, but is not particularly limited to. However, in case that the material includes silica, it may be advantageous to utilize the material in the senses that the pillar structure is feasibly formed.

The pillar structure with 500-1500 nm of height and 50-200 nm of width may be presented in a density of 20-40 millions/mm per a unit area on the surface of the material containing the pillar structure.

The nano flakes may have a needle-like or plate-like shape or a combination thereof. The nano flakes may be at a height of 10-100 nm in case of needle-like shape, and at a height of 10-100 nm and in a width of 10-100 nm in case of plate-like shape.

The ultra-low reflective surface structure may have superhydrophilicity on which pure water contact angle is less than 10 degree The ultra-low reflective surface structure may also include hydrophobic or superhydrophobic polymers between nano flakes in the nano flake layer, on the nano flake layer, or both. The hydrophobic or superhydrophobic polymer may be any one selected from the group consisting of hexamethyldisiloxane (HMDSO), tetramethylsilane, and a combination thereof.

The ultra-low reflective surface structure may have self-cleaning function along with superhydrophobicity on which pure water contact angle is more than 130 degree.

The ultra-low reflective surface structure may have light reflectance of less than 10% in a visible and infrared light wavelength region. The ultra-low reflective surface structure may also have light reflectance of less than 2% in a range of 200-1200 nm by adjusting the treatment condition. In addition, it is possible to provide a surface with light reflectance of less than 1% in a visible and infrared light wavelength region.

The ultra-low reflective surface structure may also maintain this low reflection without aging effect. Furthermore, when the ultra-low reflective surface structure further includes a hydrophobic or superhydrophobic coating, it may have self-cleaning function capable of maintaining the low reflective surface property for a long time by minimizing or removing effects of surface contaminants.

A photovoltaic system according to another embodiment of the present invention includes the ultra-low reflective surface structure or the ultra-low reflective surface with the self-cleaning function. It is possible to minimize amount of reflected light using the ultra-low reflective surface structure, thereby maintaining this performance without surface contamination for improving efficiency of photovoltaic generation.

A road sign or advertisement board according to another embodiment of the present invention includes the ultra-low reflective surface structure or the ultra-low reflective surface with the self-cleaning function. The low reflective surface may minimize amount of reflected light and make the performance maintained without surface contamination to provide a road sign or advertisement board for minimizing, influence of direction or amount of incident light.

Effects of the Invention

The method for fabrication of ultra-low reflective surface structure and the ultra-low reflective surface structure using the same provide a method to prepare an ultra-low reflective surface structure with an eco-friendly and relatively simple process. The surface structure includes a dual hierarchical protuberance structure, and may provide a long-term ultra-low reflective property without aging effect, and a surface structure with excellent hydrophilicity without separate use of a hydrophilic coating agent. In addition, the surface property may be improved to superhydrophobic surface through a hydrophobic coating process, and in this case, it is possible to provide self-cleaning function additionally.

The ultra-low reflective surface structure may be applied to, inter alia, a solar energy collecting plate, contributing to provide a method capable of solving both problems such as loss of solar energy due to reflection of incident light on the surface of the collecting plate and reduction of transmission from surface contamination. The ultra-low reflective surface structure may be applied to not only surface of various displays, advertisement boards, road signs, and vehicle window glasses, but also large surface.

EXAMPLES

Figure 1:
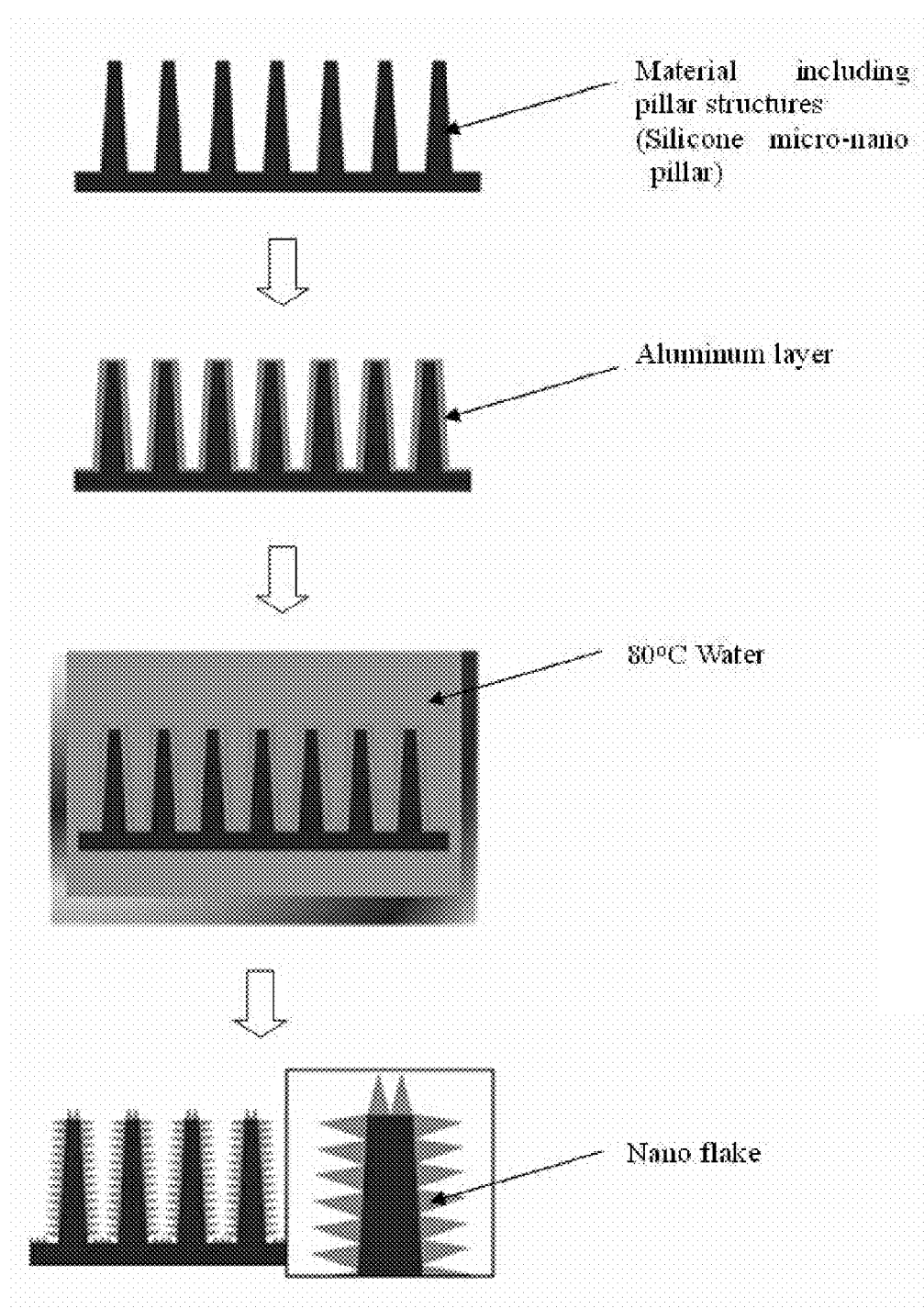
FIG. 1 is a schematic diagram to explain a method to fabricate the ultra-low reflective silicone surface with a dual nanostructure according to Example 1 of this invention by process steps.

Further scope of applicability of the present application will become more apparent from the detailed description given hereinafter. The present invention related to a method to fabricate a surface with low reflectance and self-cleaning function and the surface structure by the same to maximize efficiency of photovoltaic generation device of the present invention is explained in detail referencing FIG. 1. However the present invention can be materialized as various different forms and is not limited in the examples to be explained here.

Example 1

1) Formation of Micro-Pillar Structure

By performing $CF_4$ plasma etching on the surface of a silicone photovoltaic generation device for 30 min, a micro-pillar structure with about 500 nm of length and about 200 nm of width was formed in sample 1-1 of Example 1. The shape of the pillar has been observed as a cone-shape (See a in FIG. 3).

2) Evaporation of Aluminum Thin Layer

An aluminum layer was evaporated on the pillar structure of the sample 1-1 of the Example 1. The evaporation was accomplished under vacuum using E-BEAM EVAPORATION method and samples evaporated as 10 nm, 30 nm and 50 nm, respectively, were prepared.

3) Formation of Aluminum Nano Flake

By contacting the samples evaporating 10 nm, 30 nm, and 50 nm of aluminum, respectively, with water at over 80° C. (or vapor) for about 10 min, sample 1-2, 1-3 and 1-4 of the Example 1 where needle-like or plate-like aluminum nano flakes are formed on the micro-pillar structure were prepared.

Figure 3:
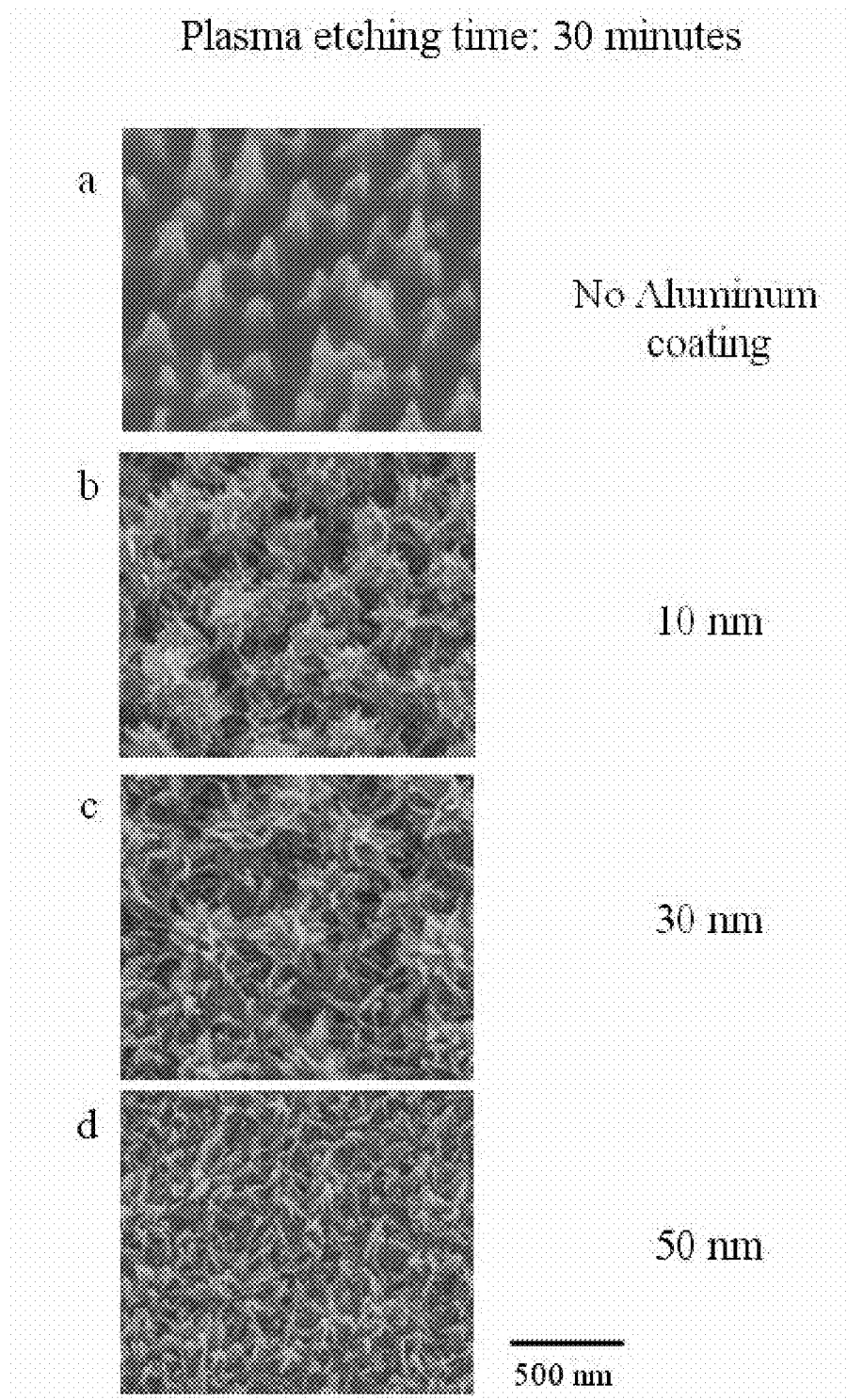
FIG. 3 is an EM image of the ultra-low reflective surface structure according to Example 1 of the present invention. a is a silicone surface without an aluminum coating; b is formed by applying 10 nm of aluminum layer; c is formed by applying 30 nm; and d is formed by applying 50 nm.

Referring to EM images (measuring identically less than 30 degree of tilt using FEI, Nova NanoSEM 200 model) in b to d of FIG. 3, it could be identified that the aluminum nano flakes were formed as a needle-like or plate-like shape on the micro-pillar structure of the sample 1-1. In each image, it has been observed that the size of nano flakes is about 50 nm of needle-like shape (sample 1-2), about 100 nm of needle-like shape (sample 1-3), and about 150 nm of plate-like shape (sample 1-4), respectively.

Example 2

1) Formation of Micro-Pillar Structure

Except by performing the $CF_4$ plasma etching for 60 min, sample 1-1 of Example 2 was prepared with the same method as 1) of Example 1. It was observed that the micro-pillar structure in the sample 1-1 of the Example 2 had about 1000 nm of length and about 250 nm of width, and the shape of pillar was a cone shape (See a in FIG. 4)

2) Evaporation of Aluminum Thin Layer

An aluminum layer was evaporated on the micro-pillar structure of the sample 1-1 of the Example 2 using the same method as 2) of Example 1.

3) Formation of Aluminum Nano Flake

By contacting the samples evaporating 10 nm, 30 nm, and 50 nm of aluminum, respectively, with water at over 80° C. (or vapor) for about 10 min, sample 2-2, 1-3 and 1-4 of the example 2 where needle-like or plate-like aluminum nano flakes are formed on the micro-pillar structure were prepared.

Figure 4:
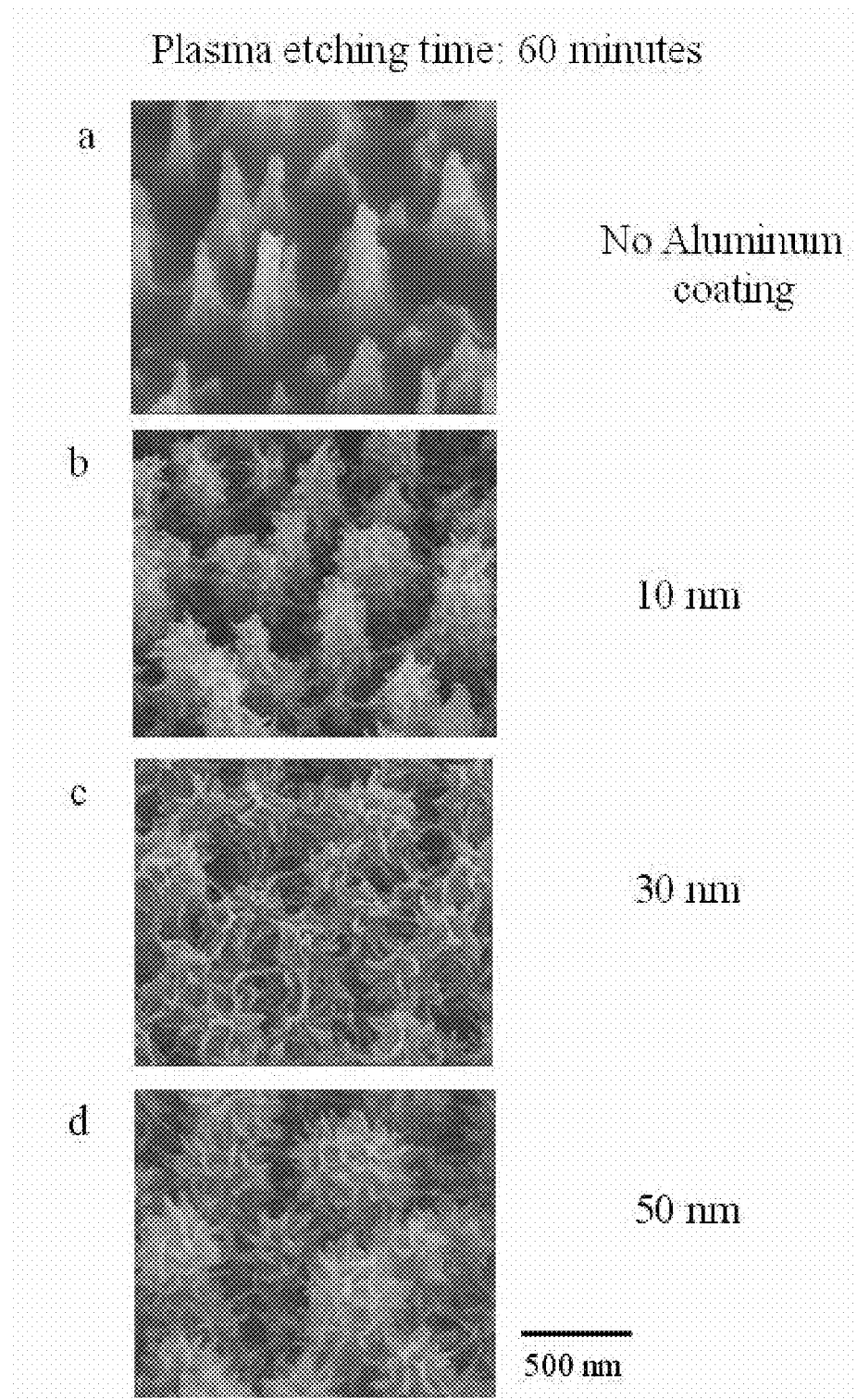
FIG. 4 represents an EM image of the ultra-low reflective surface structure according to Example 2 of this invention. a is a silicone surface without an aluminum coating; b is formed by applying 10 nm of aluminum layer; c is formed by applying 30 nm; and d is formed by applying 50 nm.
Figure 12:
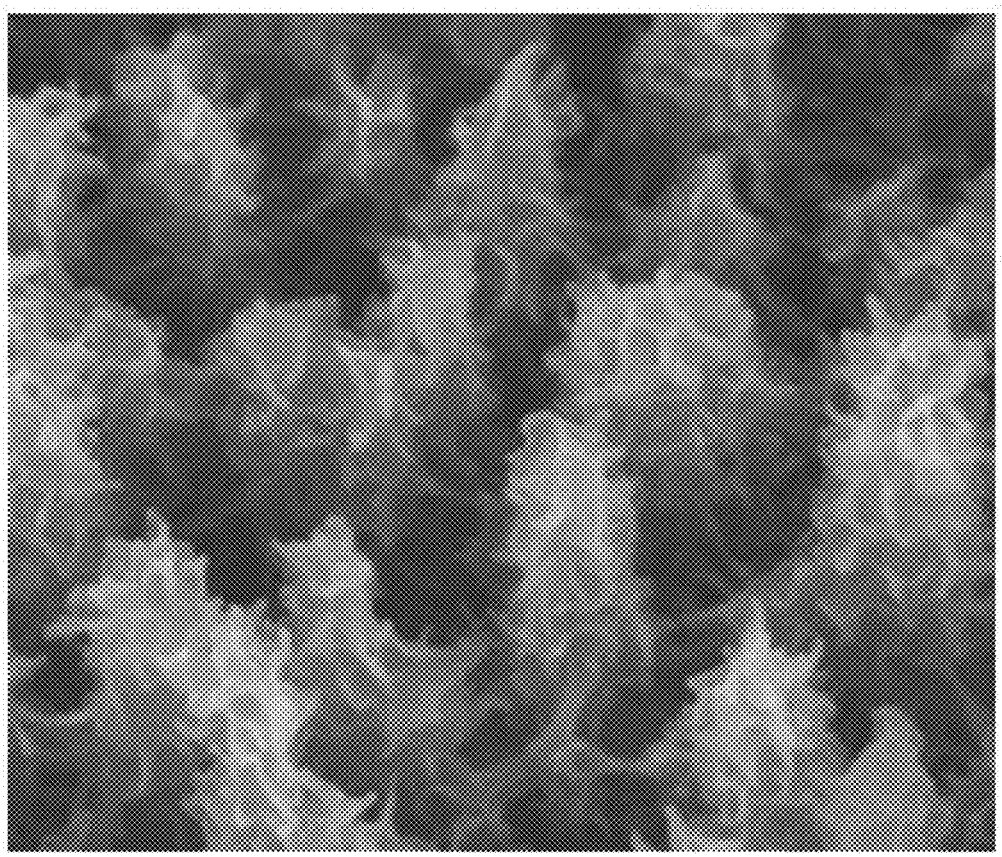
FIG. 12 is a photograph enlarging the photo image corresponding to FIG. 4b.
Figure 13:
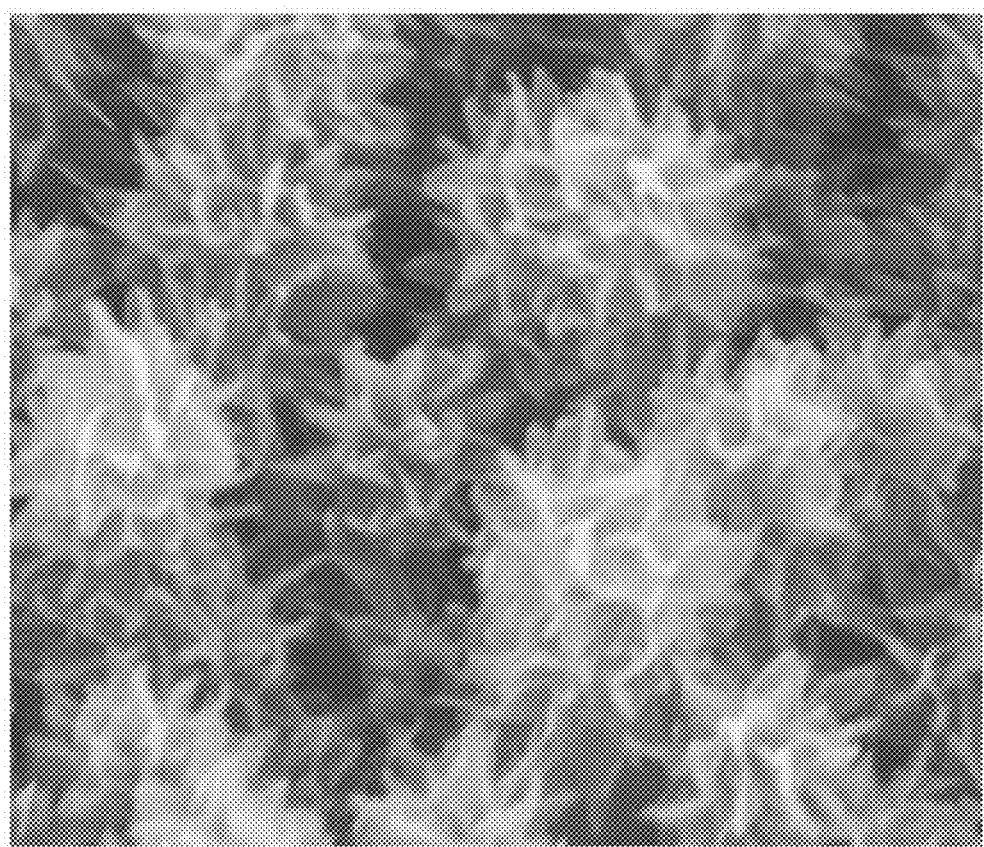
FIG. 13 is a photograph enlarging the photo image corresponding to FIG. 4d.

Referring to EM images in b to d of FIG. 4 and magnified images of FIGS. 12 and 13, it was identified that the aluminum nano flakes were formed as a needle-like or plate-like shape on the micro-pillar structure of the sample 1-1. In each image, it was observed that the size of nano flakes was about 50 nm of needle-like shape (sample 1-2), about 100 nm of needle-like shape (sample 1-3), and about 150 nm of plate-like shape (sample 1-4), respectively.

Example 3

1) Formation of Micro-Pillar Structure

Except by performing the $CF_4$ plasma etching for 90 min, sample 1-1 of Example 3 was prepared with the same method as 1) of Example 1. It was identified that the micro-pillar structure in the sample 1-1 of the Example 3 had about 1500 nm of length and about 500 nm of width and the shape of pillar was cone shape (See a in FIG. 5)

2) Evaporation of Aluminum Thin Layer

An aluminum layer was evaporated on the pillar structure of the sample 1-1 of the Example 3 with same method as 2) of Example 1.

3) Formation of Aluminum Nano Flake

By contacting the samples evaporating 10 nm, 30 nm, and 50 nm of aluminum respectively with water at over 80° C. (or vapor) for about 10 min, sample 3-2, 1-3 and 1-4 of Example 3 where needle-like or plate-like aluminum nano flakes are formed on the micro-pillar structure were prepared.

Figure 5:
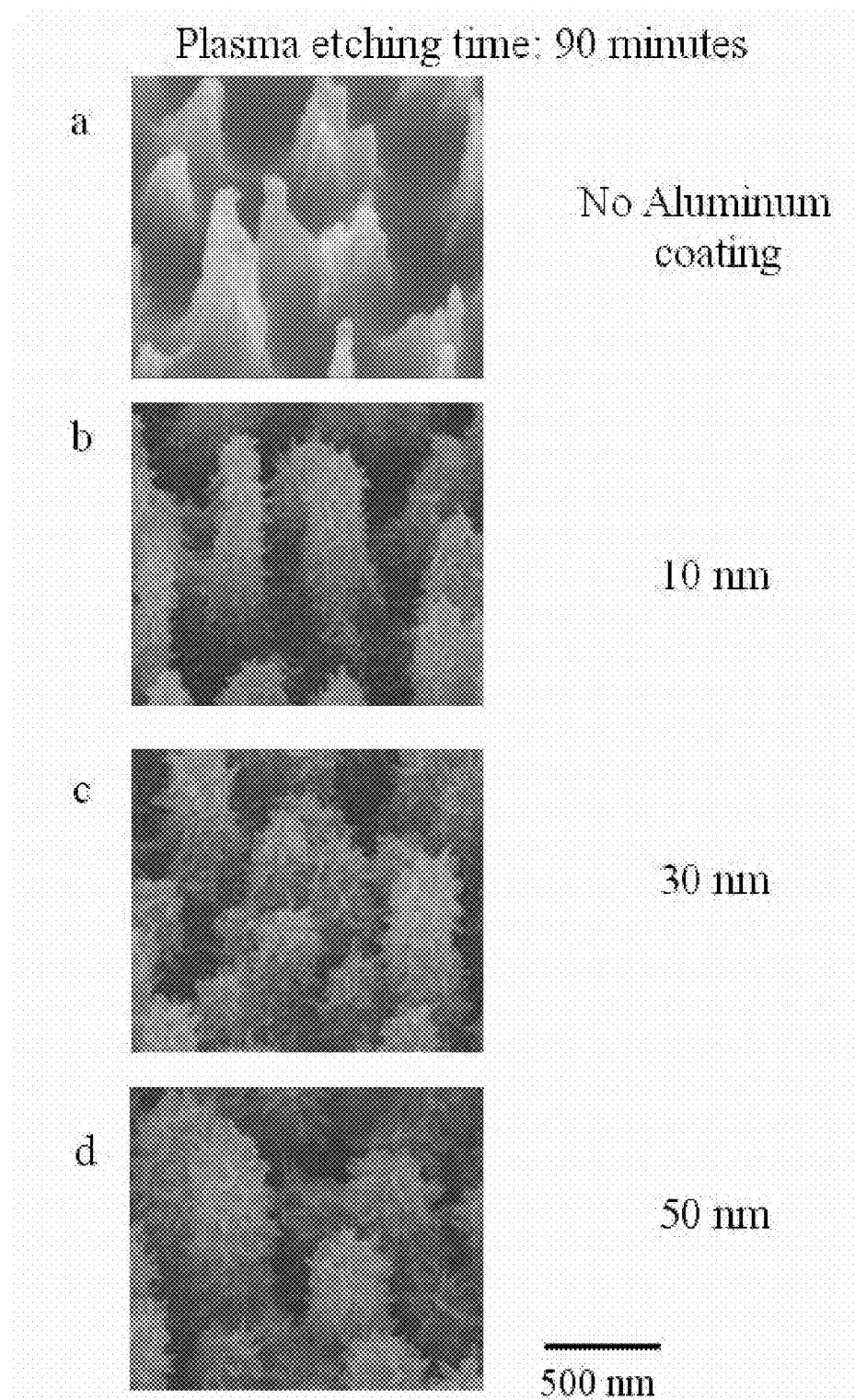
FIG. 5 is an EM image of the reflective surface structure according to example 3 of the present invention. a is a silicon surface without aluminum coating; b is formed by applying 10 nm of aluminum layer; c is formed by applying 30 nm; and d is formed by applying 50 nm.

Referring to EM images in b to d of FIG. 5, it was identified that the aluminum nano flakes were formed as a needle-like or plate-like shape on the micro-pillar structure of the sample 1-1. In each image, it was observed that the size of nano flakes was about 50 nm of needle-like shape (sample 1-2), about 100 nm of needle-like shape (sample 1-3), and about 150 nm of plate-like shape (sample 1-4) respectively.

Example 4

By evaporating about 10 nm of hexamethyldisiloxane layer to the sample 1-2 to 1-4 of Examples 1-3, each sample was prepared as a sample of Example 4.

Comparative Example 1

The silicone photovoltaic generation device applied in Example 1 was used a sample of Comparative Example 1. Different from the sample of Examples 1-3, the silicone surface itself without plasma etching or aluminum evaporation treatment was used as sample of the Comparative Example 1 for testing property of matter.

Comparative Example 2

By performing $CF_4$ plasma etching treatment, but not performing aluminum coating to the sample of Comparative Example 1, the sample having micro-pillar structure on its surface was prepared as a sample of Comparative Example 2. The etching treatment was performed for 30, 60, and 90 min, respectively, and matter property of each sample was used as Comparative Example in assessment.

Comparative Example 3

Figure 2:
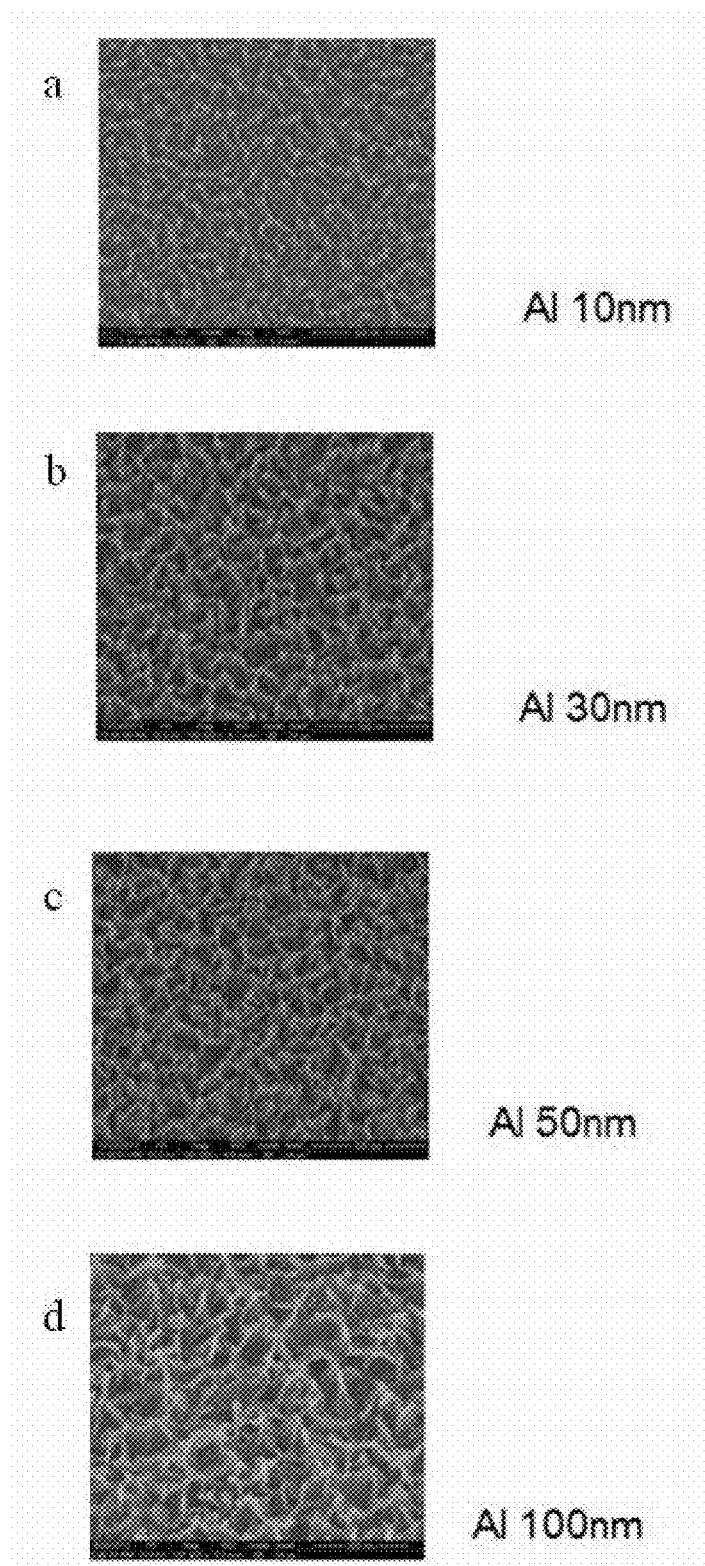
FIG. 2 is an EM (Electron Microscope) image of the ultra-low reflective surface structure according to Comparative Example 3 of the present invention. a is an example formed by applying 10 nm of aluminum layer; b is formed by applying 30 nm; c is formed by applying 50 nm; and d is formed by applying 100 nm.

After not performing $CF_4$ plasma etching treatment, but performing aluminum evaporation with 10 nm, 30 nm, 50 nm, and 100 nm of thickness to the sample of Comparative Example 1, the samples 1-1 to 1-4 of Comparative Example 3 were prepared by treating them with water (or vapor) at over 80° C. and their EM images were shown in FIG. 2. It has been identified that needle-like or plate-like nano structure was formed according to height of aluminum evaporation.

Comparative Example 4

Each untreated Si sample of Comparative Example 1 and sample of Comparative 2 treated with only plasma etching was evaporated with about 10 nm of HMDSO (Hexamethyldisiloxane) layer to utilize as samples of Comparative Example 4.

Experimental Example

1) Measurement of Surface Reflection

Figure 6:
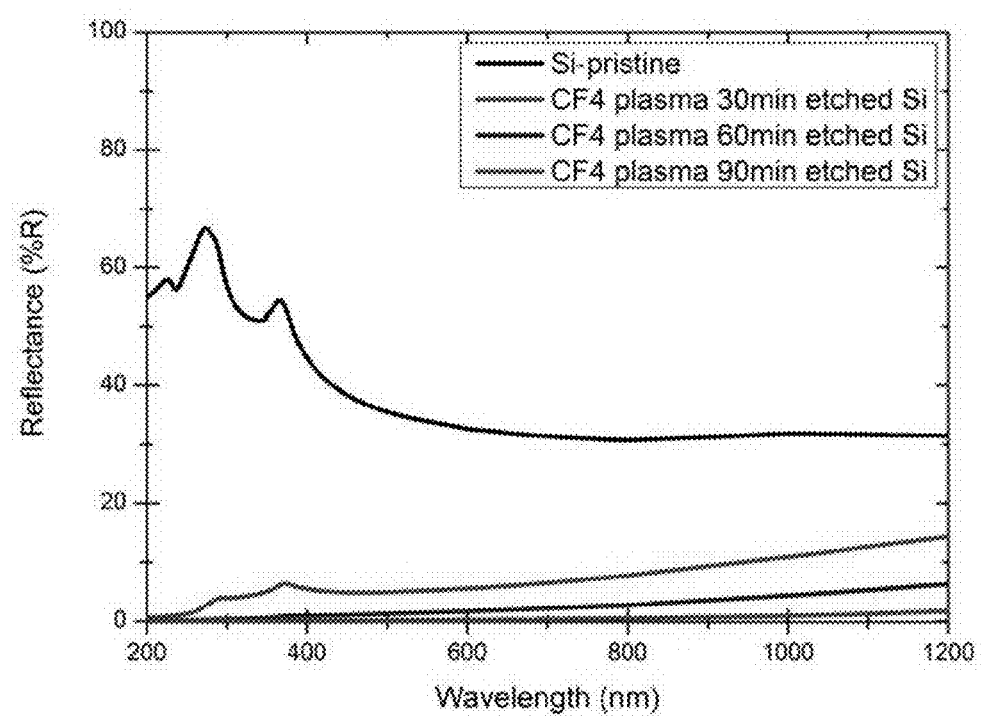
FIG. 6 shows results measuring light reflectance property for surfaces of sample of Examples 1-3 and the Comparative Example 1 without surface treatment.
Figure 7:
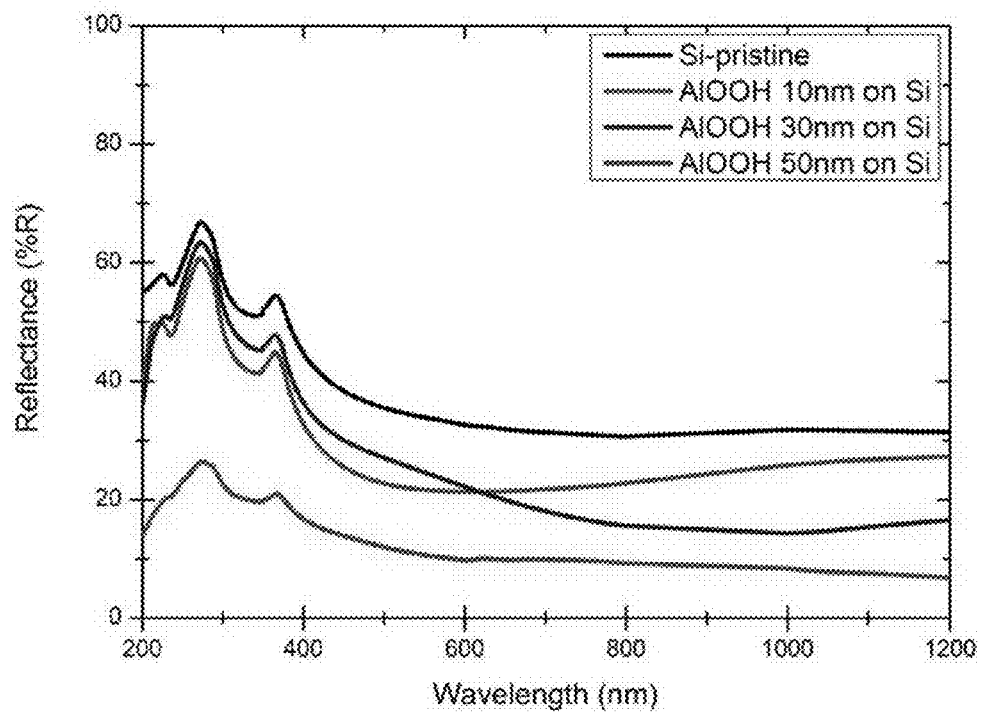
FIG. 7 is results measuring light reflectance property for surface structures with different aluminum layer in Comparative Example 3 and surface structure of the Comparative Example 1.
Figure 8:
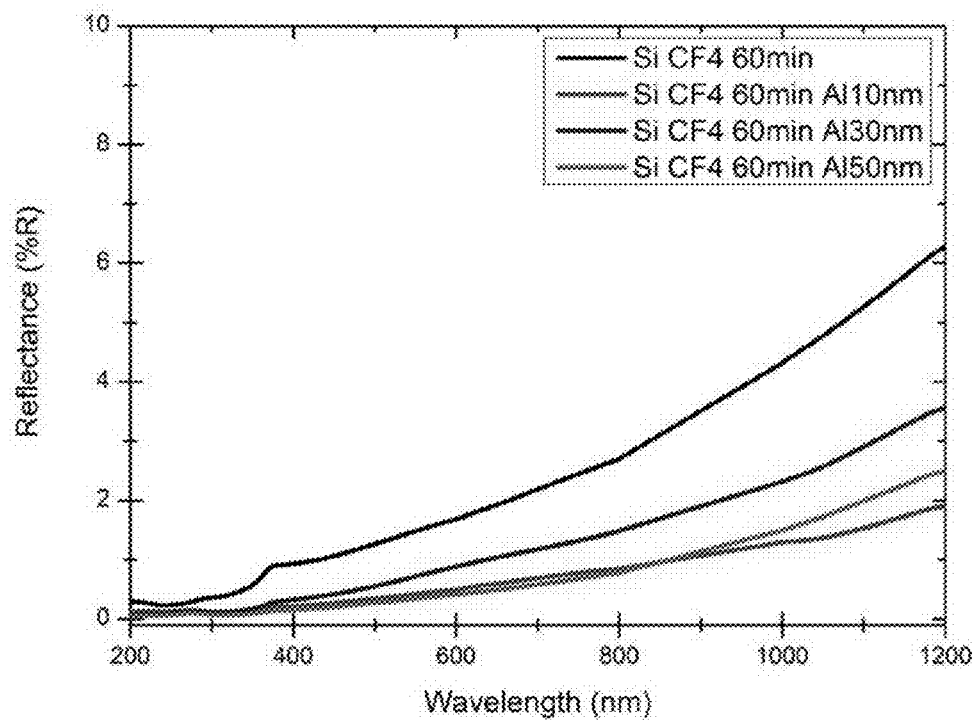
FIG. 8 shows results measuring light reflectance property in a visible and infrared light wavelength region for surface structures with different aluminum layers in Example 2 and surface structure of the Comparative Example 2 with only plasma treatment.

After background calibration, surface reflection was measured using Cary 5000 model of UV-Vis-NIR spectrophotometer and shown in FIGS. 6-8, respectively. FIG. 6 shows results of surface reflectance measurement using samples of Examples 1-3 and samples of Comparative Example 1 without surface treatment, and FIG. 7 shows results of surface reflectance measurement using surface structures with different thickness of aluminum layer of Comparative Example 3 and surface structures of Comparative Example 1. FIG. 8 shows results of surface reflectance measurement in a visible and infrared light wavelength region using samples of Example 2 with different thickness of aluminum layer and samples of Comparative Example 2 treating only plasma to the silicone surface.

As shown in the results of FIG. 6, it was identified that when the plasma treatment was longer, the surface reflectance decreased. As shown in the results of FIG. 8, it has been identified that as the results of samples with 10 nm and 50 nm of aluminum evaporation were better than the results of samples with 30 nm, the thickness of nano flake did not give large effects to the dual structure consisting of micro nano-pillars and nano flake formed on the surface. In addition, as shown in FIG. 7, it was found that the sample 1-3 of Comparative Example 3 had relatively low reflection property, but showed considerably high reflectance result in comparison with results of about 4% R of the FIG. 8 and it was identified as the result of apparently low reflectance in comparison with results of Comparative Examples 1 and 3.

Figure 9:
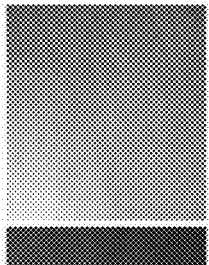
FIG. 9 represents images to samples of Comparative Example 3 and Examples 1-3 taken under white light.

In addition, images of samples in Comparative Example 3 and Examples 1-3 taken under white light were illustrated in FIG. 9. As shown in the FIG. 9, it was identified that the samples of Examples 1-3 had significantly low reflection property in comparison with the comparative sample 3 and especially it was quantitatively observed that a surface with optically significantly low reflection could be obtained for plasma etching of silicone surface for more than 60 min and more than 10 nm of aluminum layer.

2) Measurement of Contact Angle (Assessment of Superhydrophobicity)

The measurement of contact angle was performed with Goniometer (Data Physics instrument Gmbh, OCA 20L). This apparatus permits to measure an optical image and contact angle of a sessile droplet on the surface. Static contact angle was measured by gentile landing of 5 ml droplet on the surface.

Figure 10:
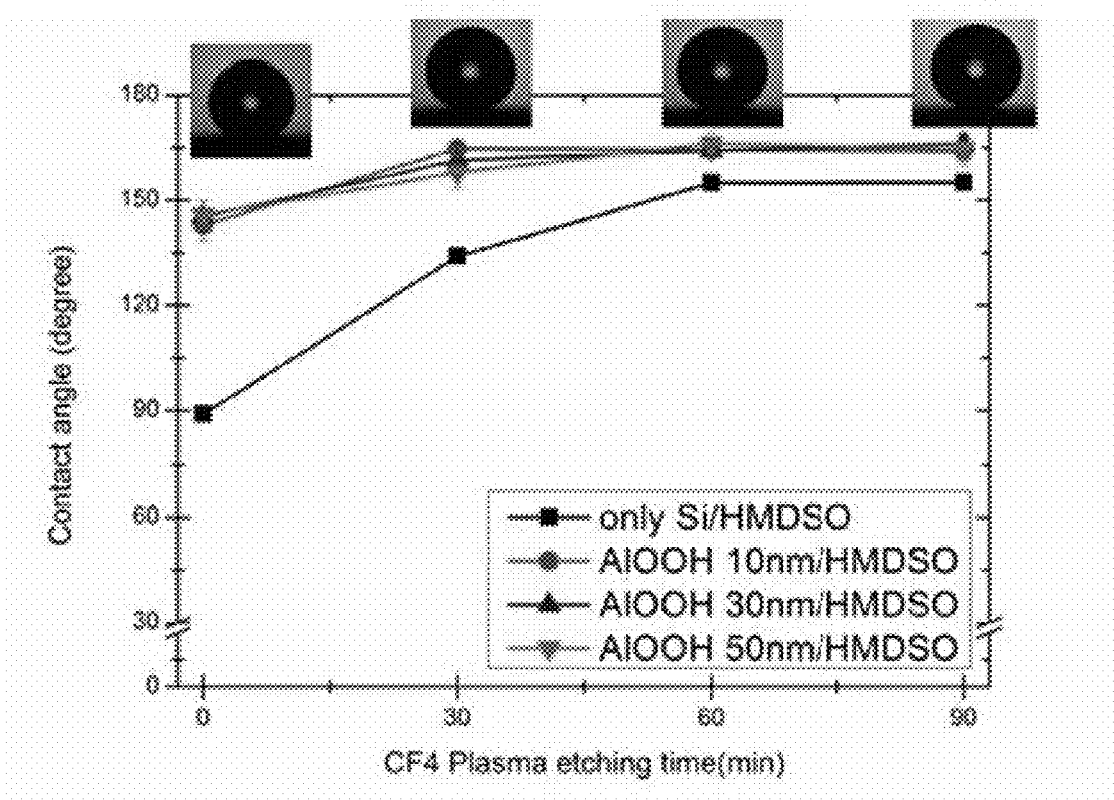
FIG. 10 is results measuring contact angle to water using samples of Example 4 and Comparative Example 4.

FIG. 10 shows results measuring contact angle to water using samples of Example 4 and Comparative Example 4. As shown in FIG. 10, it has been found that the samples forming nano flakes had excellent superhydrophobicity and results of the Example 4 had much superior superhydrophobicity even in comparison with sample properties of the Comparative Example 4.

3) Measurement of Aging Effect (Assessment of Superhydrophobicity)

Figure 11:
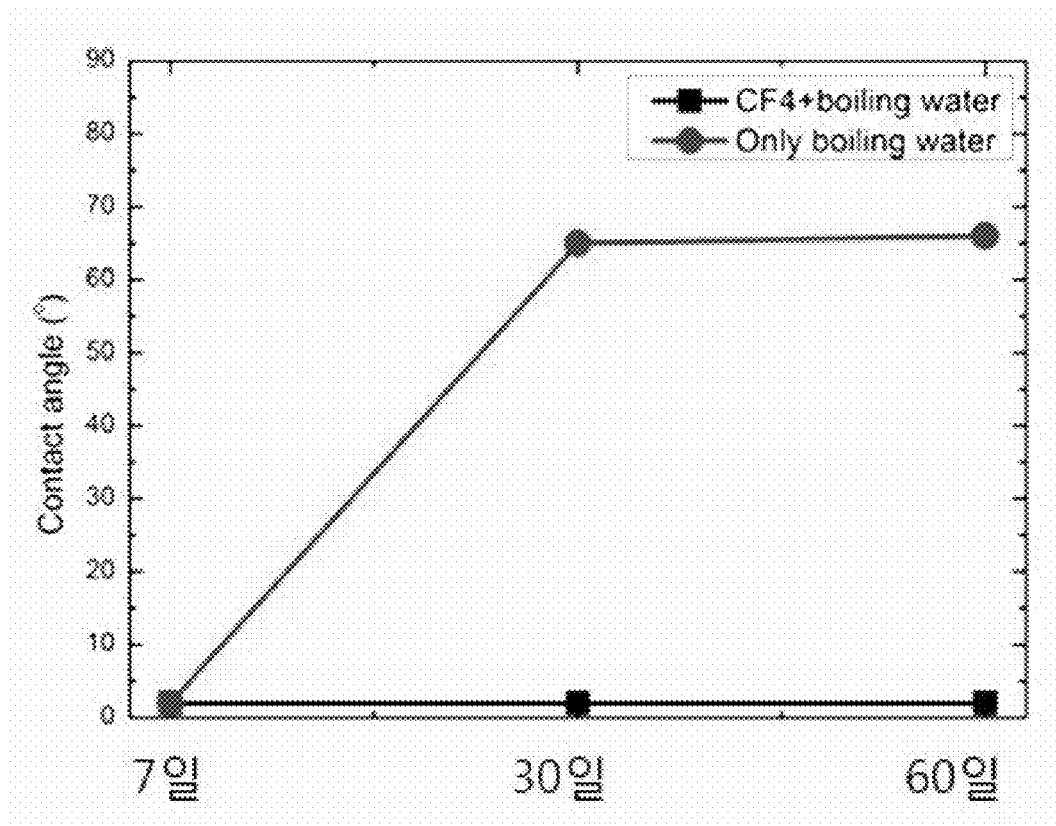
FIG. 11 shows results measuring contact angle with 30 days of interval to measure durability of superhydrophobic coating film of Comparative Example 3 (evaporation of aluminum 50 nm) and Example 3 (treatment with boiling water for 10 min after $CF_4$ plasma treatment for 30 sec).

In order to assess durability property of Example 4 and Comparative Example 1, contact angle to pure water was measured in state of exposing the samples in the air with 30 days of interval with time passing and the results were shown in FIG. 11. As shown in FIG. 11, it has been found that the samples corresponding to Example of the present invention showed no change of contact angle and thus maintain the surface property of superhydrophobicity.

According to the example of the present invention, aluminum nano flakes are formed as a plate-like shape on the surface of micro pillar structure to fabricate a surface with optically low reflection. In addition, it was also identified that as the surface of this very rough dual nano structure shows supehydrophilic property with less than 10 degree to contact angle to pure water by itself and it was possible to obtain superhydrophilic/superhydrophobic surface by coating a hydrophilic agent or hydrophobic agent according to use thereof.

This ultra-low reflective surface or ultra-low reflective superhydrophobic surface may be applied to fields requiring low reflection property, inter a/ia, to photovoltaic generation system. In the photovoltaic generation system, there have been problems that surface are contaminated by lowering of the surface durability and thus reduction of absolute amount of incident light. When applying the ultra-low reflective and superhydrophobic nano structure of the present invention to photovoltaic generation system, it is possible to reduce loss of incident light by decreasing surface reflection and always maintain clean surface due to superhydrophobic surface with self-cleaning function to solve problems of incident light reduction from contamination.

Having described a preferred embodiment of the present invention in detail, the foregoing embodiments and advantages are merely exemplary and are not to be constructed as limiting the present disclosure. It is to be understood that variants and modifications thereof falling within the scope of this invention defined as appended claims may become apparent to those skilled in this art.

What is claimed is:

1. A method for fabrication of ultra-low reflective surface structure, comprising:
    a first step to prepare a material containing a pillar structure on a surface thereof;
    a second step to prepare an aluminum surface-material by forming aluminum layer on the pillar structure of the material; and
    a third step to prepare ultra-low reflective surface with a dual protuberance structure by oxidizing aluminum on the aluminum surface-material to form a nano flake layer onto the pillar structure of the surface;
    wherein the nano flake layer comprises needle or plate nano flakes formed onto the pillar structure of the surface.

2. The method for fabrication of ultra-low reflective surface structure of claim 1,
    wherein the pillar structure in the first step is formed by etching the surface of the material according to at least one method selected from the group consisting of plasma etching, reactive ion etching, ion-milling, and electro discharge machining (EDM).

3. The method for fabrication of ultra-low reflective surface structure of claim 1,
    wherein the pillar structure in the first step is formed by plasma etching for the surface of the material between 30 sec and 90 min, comprising any one reactive gas selected from the group consisting of $CF_4$, $CHF_3$, $C_2F_6$, $C_2Cl_2F_4$, $C_3F_8$, $C_4F_8$, $SF_6$ and a combination thereof.

4. The method for fabrication of ultra-low reflective surface structure of claim 1,
    wherein the aluminum layer in the second step is formed by at least one process selected from the group consisting of sputtering, e-beam evaporation, and thermal evaporation.

5. The method for fabrication of ultra-low reflective surface structure of claim 1,
    wherein the oxidation in the third step is performed by contacting aluminum on the aluminum surface material with a water-containing reactive solution or vapor therefrom.

6. The method for fabrication of ultra-low reflective surface structure of claim 5,
    wherein the reactive solution or vapor therefrom has temperature at a range of 70 to 90° C.

7. The method for fabrication of ultra-low reflective surface structure of claim 1,
    wherein the nano flake comprises any one selected from the group consisting of boehmite (ALO(OH)), aluminum oxide ($Al_2O_3$) and a combination thereof.

8. The method for fabrication of ultra-low reflective surface structure of claim 1,
    wherein the ultra-low reflective surface has hydrophilicity on which pure water contact angle is less than 10 degree.

9. The method for fabrication of ultra-low reflective surface structure of claim 1,
    wherein the method further comprises the fourth step of applying a hydrophobic coating on the ultra-low reflective surface after the third step.

10. The method for fabrication of ultra-low reflective surface structure of claim 1,
    wherein cone shaped pillars with 500-1500 nm of height and 50-200 nm of width are presented within 20-40 millions/mm per a unit area on the surface of the material comprising the pillar structure.

11. The method for fabrication of ultra-low reflective surface structure of claim 1,
    wherein the aluminum layer is formed in a thickness of 10-100 nm.

* * * * *